US006235553B1

(12) United States Patent
Kawan

(10) Patent No.: US 6,235,553 B1
(45) Date of Patent: May 22, 2001

(54) METHOD AND SYSTEM FOR CREATING AND USING AN ELECTROSTATIC DISCHARGE (ESD) PROTECTED LOGOTYPE CONTACT MODULE WITH A SMART CARD

(75) Inventor: Joseph C. Kawan, Hollywood, CA (US)

(73) Assignee: Transaction Technology, Inc.

(*) Notice: Subject to any disclaimer, the term of this patent is extended or adjusted under 35 U.S.C. 154(b) by 0 days.

(21) Appl. No.: 09/190,265

(22) Filed: Nov. 12, 1998

Related U.S. Application Data

(63) Continuation-in-part of application No. 08/784,262, filed on Jan. 15, 1997, now Pat. No. 5,837,153.

(51) Int. Cl.⁷ .......................... H01L 21/44; H01L 21/48; H01L 21/50; H01L 23/552; H01L 23/02

(52) U.S. Cl. .......................... 438/107; 257/679; 257/660; 257/659; 438/106; 438/108

(58) Field of Search .................. 438/106, 107, 438/108; 257/659, 660, 679

(56) References Cited

U.S. PATENT DOCUMENTS

| | | | |
|---|---|---|---|
| 4,586,105 | * 4/1986 | Lippmann | 361/117 |
| 4,711,690 | 12/1987 | Haghiri-Tehrani . | |
| 4,779,898 | 10/1988 | Berning et al. . | |
| 5,251,937 | 10/1993 | Ojster . | |
| 5,383,687 | 1/1995 | Seuss et al. . | |
| 5,665,650 | 9/1997 | Lauffer et al. . | |
| 6,078,068 | * 6/2000 | Tamura | 257/203 |

OTHER PUBLICATIONS

Photocopy of Concept Card—MasterCard International, 1995.
"3–D Home Architect" Quick Start Card, 1993, p. 5.
Citicorp Letterhead, 1994, Logo on top of sheet D19/1.
Anonymous, Improvement of C–4 Chip Soldering Process, Research Disclosure, Aug. 1989, p. 568 (30415).
International Search Report dated Apr. 27, 1998.

* cited by examiner

*Primary Examiner*—Charles Bowers
*Assistant Examiner*—Nema Berezny
(74) *Attorney, Agent, or Firm*—George T. Marcou; Kilpatrick Stockton LL

(57) ABSTRACT

A method and system for providing specialized contacts for electronic information on a smart card or other device in the pattern of a source identifier, such that a machine may contact and read the information upon placement of the card in the machine. The contact points for reading information on the card are formed by etching a substrate attached to the logic element of the smart card. The etching allows both the foreground and the background of an image, in two selected colors, to be included within the contact area of the smart card, with the foreground constituting the conductor and the background the substrate. Additionally, the present invention provides electrostatic discharge (ESD) protection for a semiconductor circuit within the smart card without changing the appearance or method of forming the contact points.

28 Claims, 10 Drawing Sheets

METHOD AND SYSTEM FOR CREATING AND USING AN ELECTROSTATIC DISCHARGE (ESD) PROTECTED LOGOTYPE CONTACT MODULE WITH A SMART CARD

CONTINUING DATA

This application is a Continuation-In-Part of application Ser. No. 08/784,262 filed on Jan. 15, 1997, U.S. Pat. No. 5,837,153.

FIELD OF THE INVENTION

The present invention relates to the field of smart card technology. In particular, the invention provides a method and system for using a semiconductor chip in a plastic card with contacts for use with a smart card reader where the semiconductor chip is protected from electrostatic discharge (ESD).

BACKGROUND OF THE INVENTION

A smart card is the size and shape of a credit card but has a miniature computer. The miniature computer enables the smart card to perform numerous functions that otherwise could not be performed by a card with a magnetic strip. For example, a smart card may contain user identification data that prohibits unauthorized use. Security is accomplished by using sophisticated cryptographic techniques for communication between the smart card and reading devices. For a general description, see, e.g., "Overview and Applications of Smart Card Technology," at http://www.vitro.bloomington.in.us:8080/2Og4/smrtcard.html; Jose L. Zoreda & Jose Manuel Oton, Smart Cards, (Artech House, Inc. 1994).

A smart card typically contains a Self-Programmable One-Chip Microcomputer (SPOM) with eight metallic metal pads, usually copper, for electronic contact points for communication of data between the smart card and a reading device. The contact points provide power, an input/output for serial data communication, a connection for reading the smart card clock signal, a connection for resetting the smart card, and a connection for the programming voltage of the smart card. Thus, only six of the eight contact points are generally used by present smart cards on the market; the other two are reserved for future use.

The size, function, and location of these contacts are dictated by an industry standard. ISO 7816-2 and 7816-3. This enables the various manufacturers and users of smart cards to create cards and compatible devices to work with the cards.

Smart cards generally contain Random Access Memory (RAM), Read Only Memory (ROM), and Electrically-Erasable Programmable Read Only Memory (EEPROM). The smart card processor typically has an 8-bit data path and 8-bit registers, and the card operates using an operating system selected for the particular application needs.

One aspect of smart cards is the method used for combining the appearance of the card and the need for contact points on the surface. Prior art includes printing verbiage and coloring the contacts with a process that may use either silk screen color or electroplated color. For example, a recently released Mastercard smart card consists of a chip module face with interlocking globes constructed of different contact materials, onto which were added a colored surface to produce letters and image outline.

Another feature of smart card technology is the need to protect the processor from electrostatic discharge (ESD). As the card is carried about, slid into and out of a card holder such as a wallet and slid into card readers, static charges accumulate on the card. When enough charge has accumulated at a particular point on the card, it will attempt to travel to the lowest potential voltage available to it. Typically this lowest potential is ground. If the accumulated charge travels to one of the contact points and through the processor in its attempt to reach a lower potential, the processor will be damaged. This happens because the charge that accumulates can be quite large compared to the maximum voltages and currents the processor is designed to accept. An ESD that travels through a processor is typically large enough to burn or otherwise damage transistors and conductors within the processor such that the processor becomes unoperational after receiving such a charge.

SUMMARY OF THE INVENTION

This invention presents a method and system for combining images, words, and identifiable patterns with the eight contact points of a smart card without using silk screen or electroplated color. In particular, the invention uses a single conductive surface, similar to a printed circuit board, from which a logotype is etched away, leaving the separated contact points. In particular, the contact points are shaped into a source identifier that an individual can immediately recognize and associate with a company, partnership or corporation.

Additionally, the present invention also provides a system that provides ESD protection for the processor by placing a grounded conductive path near the conductors to the semiconductor chip in such a manner so as not to disturb the appearance of the contact points whether they be shaped as a logo or otherwise.

The present invention accomplishes this by placing the conductive path on the back side of the substrate so that it is not visible. The contact points on the front side of the substrate are subject to the wear and tear of being slid into and out of wallets, card holders, purses, pockets, and card holders. Some contact points receive severe abrasions from this physical contact. Similarly, the protective conductor, when placed on the front side of the substrate, can be scratched and damaged as the card is used and carried about. It is possible that the ESD protective device could become scratched to the point where it can no longer conduct an ESD to the ground potential such that the ESD could travel through the semiconductor chip and damage it.

The present invention also allows implementation into an existing process without the need to alter the fabrication process involved in forming the contact points. Typically, contact points patterned into a logo are complicated in that multiple colors and layers are used to design them. Since the present invention is implemented in a non-visible portion of the smart card, or equivalent device, the addition of ESD protection using the present invention is less costly.

To achieve the stated and other objects of the present invention, as embodied and described below, the invention may comprise the steps of: etching a first conductive material on a back side of a substrate to form a plurality of bonding points coupled to a semiconductor chip and a conductive path directly coupled to one bonding point and being laid out in a proximal position to the remaining bond points; attaching said semiconductor chip to a back side of a substrate; creating holes through the substrate directly above the bonding points; and depositing and etching a second conductive material onto a front side of the substrate so as to form contact points which are electrically coupled to the bonding points via the holes through the substrate.

Additional objects, advantages and novel features of the invention will be set forth in part in the description which follows, and in part will become more apparent to those skilled in the art upon examination of the following or may be learned by practice of the invention. The objects and advantages of the invention may be realized and attained by means of the instrumentalities and combinations particularly pointed out in the appended claims.

It should be noted that the drawings are not necessarily to scale but are instead illustrative of the relationship between the various elements shown.

DETAILED DESCRIPTION OF THE PREFERRED EMBODIMENTS

An embodiment of the present invention uses a printed circuit board process in conjunction with the smart card chip module. A substrate with a contact material, such as copper, is used on the front surface of the smart card. The contact material is etched from this surface to conform to the standard contact points for a smart card reader. At the rear of the card, a semiconductor chip is pasted or glued in place and is either lead bonded to the contact plates, or a flip chip is used. With a flip chip, a semiconductor chip is flipped over and either soldered directly to the contacts via feed-throughs to the front surface or makes electrical contact with the contacts via an epoxy and the feed throughs to the front surface.

The present invention also provides for a grounded conductive path to receive electrostatic discharge (ESD) from any of the conductors external to the semiconductor chip (i.e., bonding points, contact points, or bond wires). In the present invention, this grounded conductive path is placed so as to be on the back side of the substrate and thereby so as not to interfere with appearance of the contact points formed on the front side of the substrate.

Figure 1:
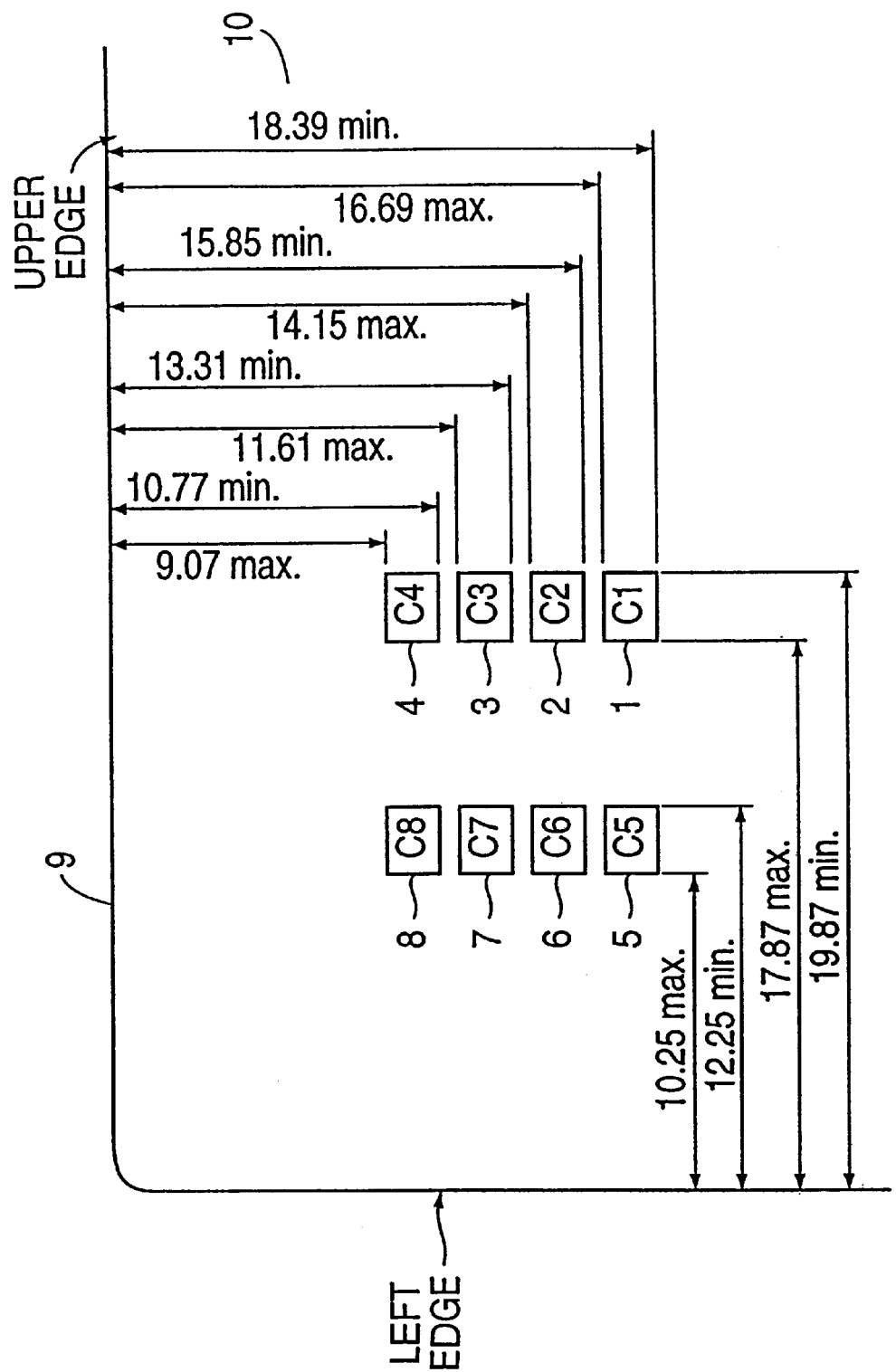
FIG. 1 is a diagram of the standard dimensions for smart card contact points.

As shown in FIG. 1, a standard exists for placement of the contact points 1 through 8 relative to the card edge 9. The contact points provide power 1 and ground 5, an input/output for serial data communication 7, a connection for reading the smart card clock signal 3, a connection for resetting the smart card 2, and a connection for the programming voltage of the smart card 6. Placement limits for the contact points is precisely measured 10 and 11 from the edge of the card 9.

Using a selected design for etching, the conductive surface is etched away leaving the substrate between the contacts. The substrate is usually a glass or epoxy board, which may be obtained in different colors, such as blueboard, greenboard, or blackboard. The substrate acts as an insulator between the contact points. This process avoids the printing of verbiage and coloring of contacts of the prior art using either silk screen color or electroplated color. Thus, the secondary process of coloring the logotype material, which can cause registration problems with the smart card, are avoided.

Figure 2:
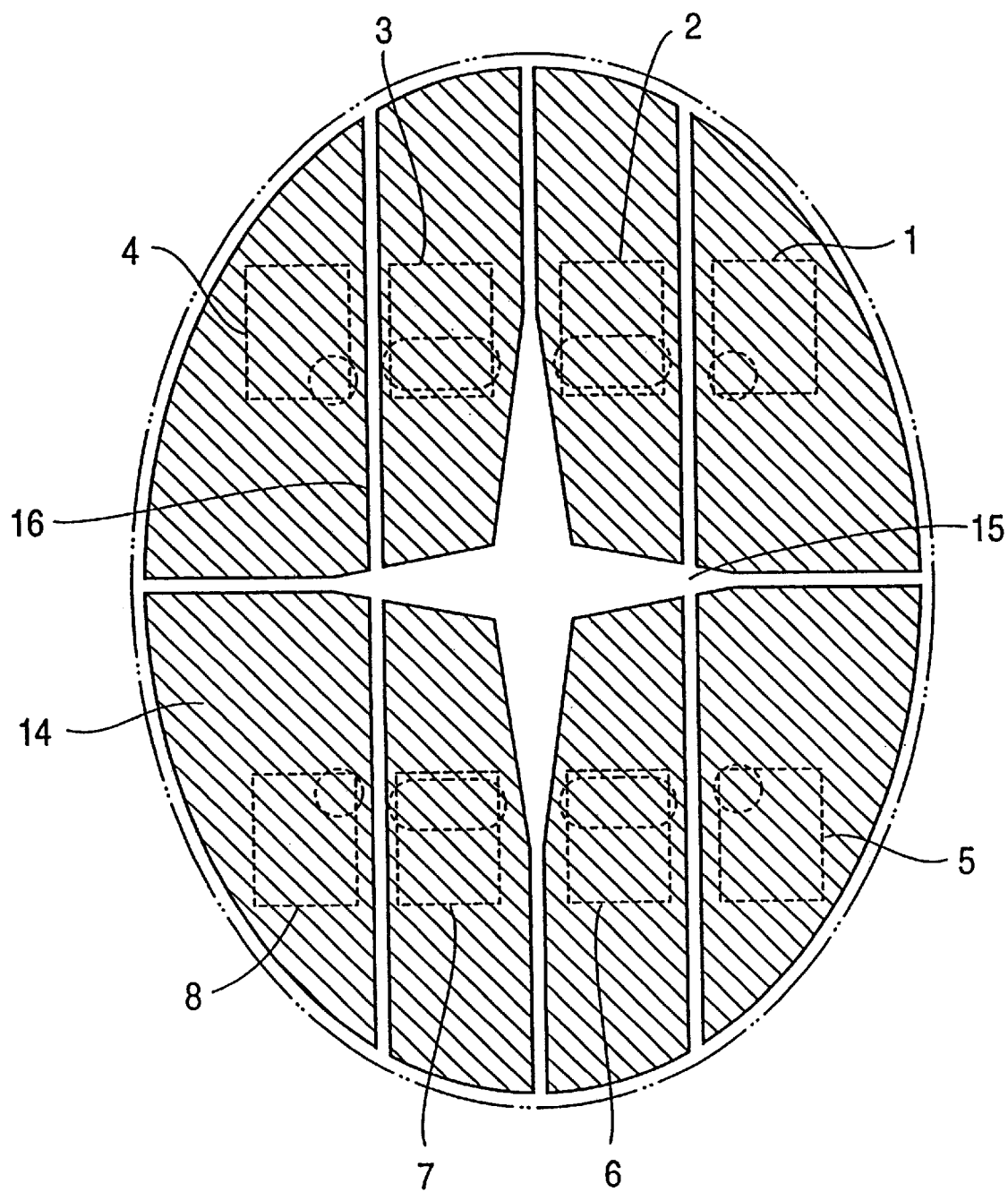
FIG. 2 is an example smart card logotype incorporating a preferred embodiment of the invention.

For example, for the Citibank logotype shown in FIG. 2, the process uses the image of a four-pointed star inside an oval background. This logotype is easily recognizable by people to be Citibank's logotype. Thus, the card is identified as coming from the source corporation, Citibank.

Similarly, the logotype could include a square, circular, or rectangular background. The contacts 1 through 8 are connected to the surface metal in the area of the background of the star 14. This surface contact material is then etched away to expose the substrate 15. The boundaries between the contacts 16 are also etched away to isolate them from one another.

Figure 3:
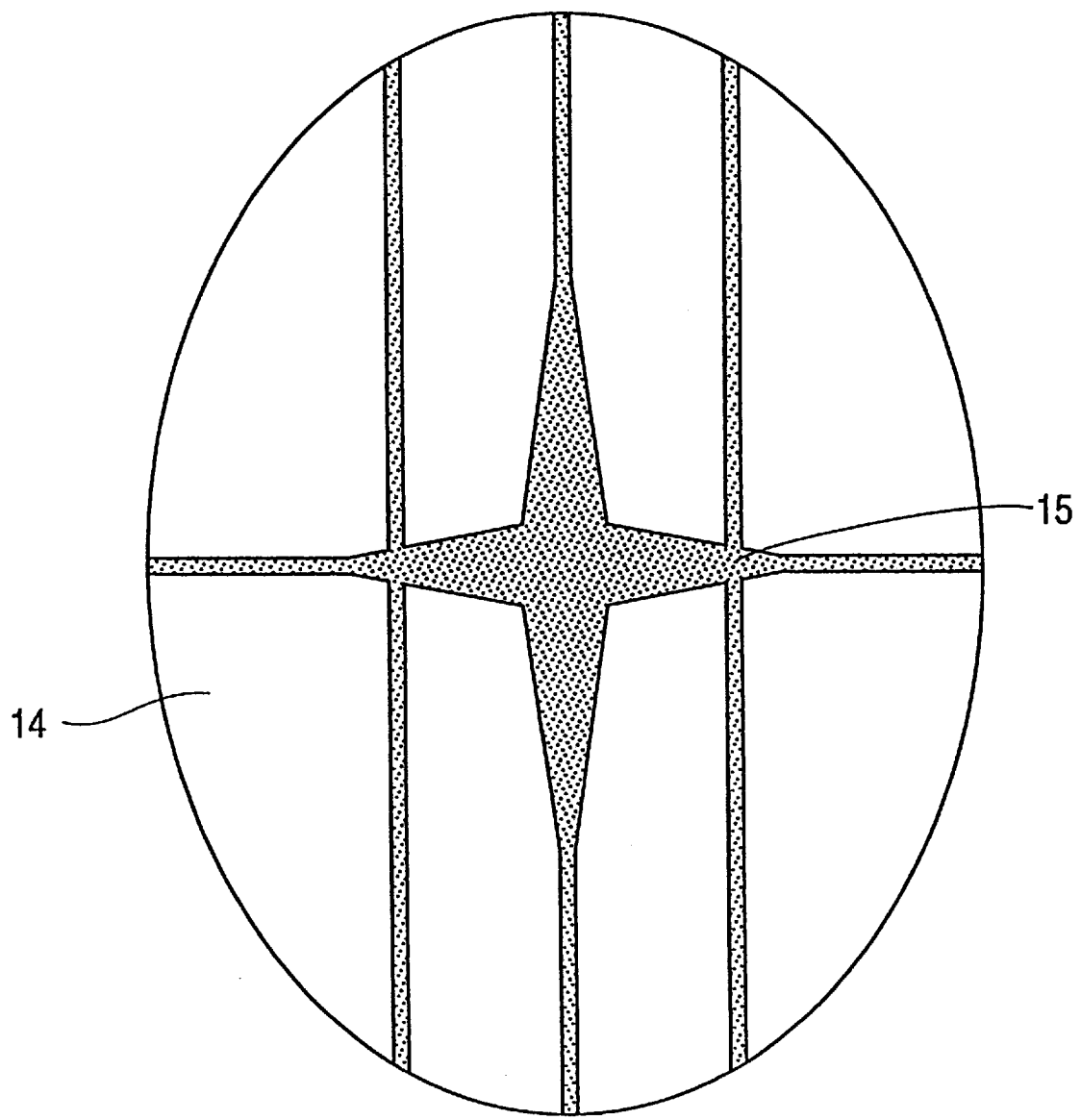
FIG. 3 is an example of the smart card logotype appearance after etching is completed in accordance with a preferred embodiment of the present invention.

Thus, the invention provides a methodology to obtain a low cost implementation for a logotype utilizing the substrate as the color without having to use a secondary process of coloring the logotype material. A preferred embodiment presents the final appearance shown in FIG. 3, with the background of the logotype 14 and the etched area 15 producing the star shape. This preferred embodiment thus eliminates a secondary process that could cause registration problems with the card. In an embodiment of the present invention, the substrate technology is used to provide the color that represents the blue of the star, with the background consisting of the copper contacts that normally are gold, but that would be plated silver or gold depending on the type of card. In another embodiment, a black substrate to represent the background of the oval is used with gold plated contacts.

Another aspect of an embodiment of the present invention is the fabrication process used for this type of smart card. The chip module, which is essentially a tiny printed circuit board, for convenience and automation is made part of a tape or strip so that the chips are precisely feedable into position in a mechanism that is used to punch out the chip module. This chip module is then placed in a cavity in the smart card by a machine. This fabrication and emplacing includes an automated process.

The strip production comprises the following steps. The contacts are automatically registered in the chip module. This involves attaching the smart card computer chip or semiconducting device, which could include a logic element or even a complete computer, through soldering or normal lead bonding to the contact locations. The chip is then encapsulated or otherwise provided with protection. Since the substrate is in a continuous strip, a resulting continuous strip of logotype chip modules are produced. The logotype modules are then punched from the strip for feeding into the smart card.

The smart card is physically similar to a credit card. A cavity is drilled into the smart card plastic in the same shape as the chip module. In an embodiment of the present invention, glue is put in place in the card, and the chip module is punched out of the tape, placed in this cavity, and glued in place. In another embodiment, a melt technology is used for inserting the chip module into the card.

In terms of the circuit board process, a very thin substrate is used with copper with silver plating or another conductive material on top of the substrate. A standard circuit board type etching takes place on the surface, in which the resist is put down onto the copper and a negative photographically developed image of the desired logotype shape and contact is exposed. In an embodiment of the present invention, the final image includes eight contacts on the board in the foreground of the image and the substrate in the background.

Figure 4:
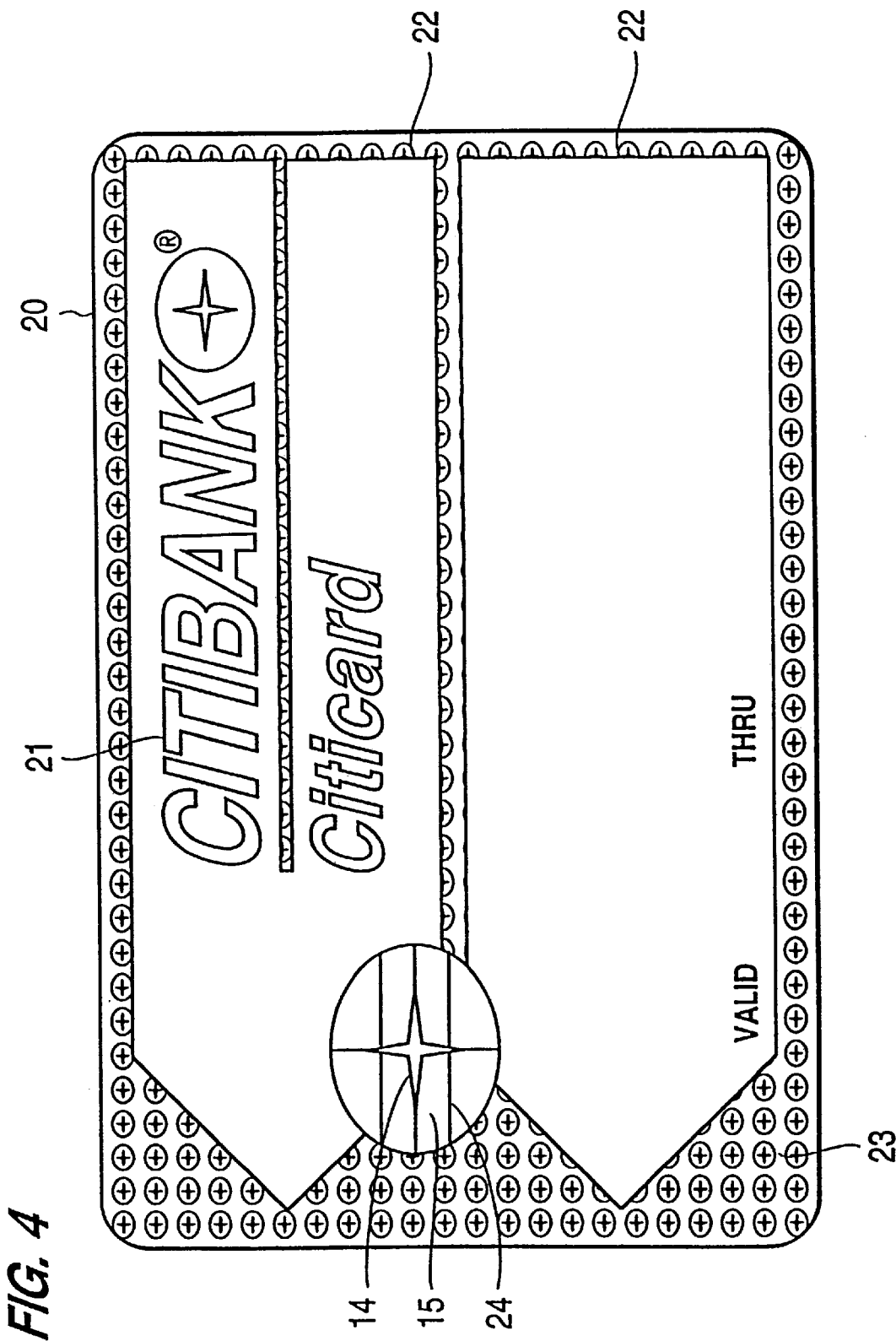
FIG. 4 is an example of a smart card appearance with the logotype chip module in place in accordance with a preferred embodiment of the present invention.

The final appearance of an embodiment of the present invention for an example Citibank card is shown in FIG. 4. The smart card 20 contains printed words 21, shading 22, and background pattern 23, comprising ink on the plastic part of the card 20. The logotype 24 with contact material 14 and exposed substrate 15 is positioned so as to be properly readable by smart card reader.

In order to provide adequate ESD protection for a smart card, the conventional practice is to run a conductive loop around the contact points on the face of the smart card. Typically, the spacing between the conductive path and the contact points is on the order of a few thousandths of an inch. The actual size of the spark gap is usually determined by first determining the minimum ESD voltage or current a semiconductor circuit can handle without damaging the circuit. This value is then used to calculate the size of the gap using conventional techniques. A dielectric material may be added to further adjust the amount of ESD protection provided by a particularly sized spark gap. The present invention provides for ESD protection without running a conductive path on the face of the card, as is done in the conventional art. Instead, the grounded conductive path is laid out on the back side of the substrate so that it is not visible to the user. This can be accomplished in one of two ways depending on the technology being used to connect the semiconductor chip with the card.

Figure 5:
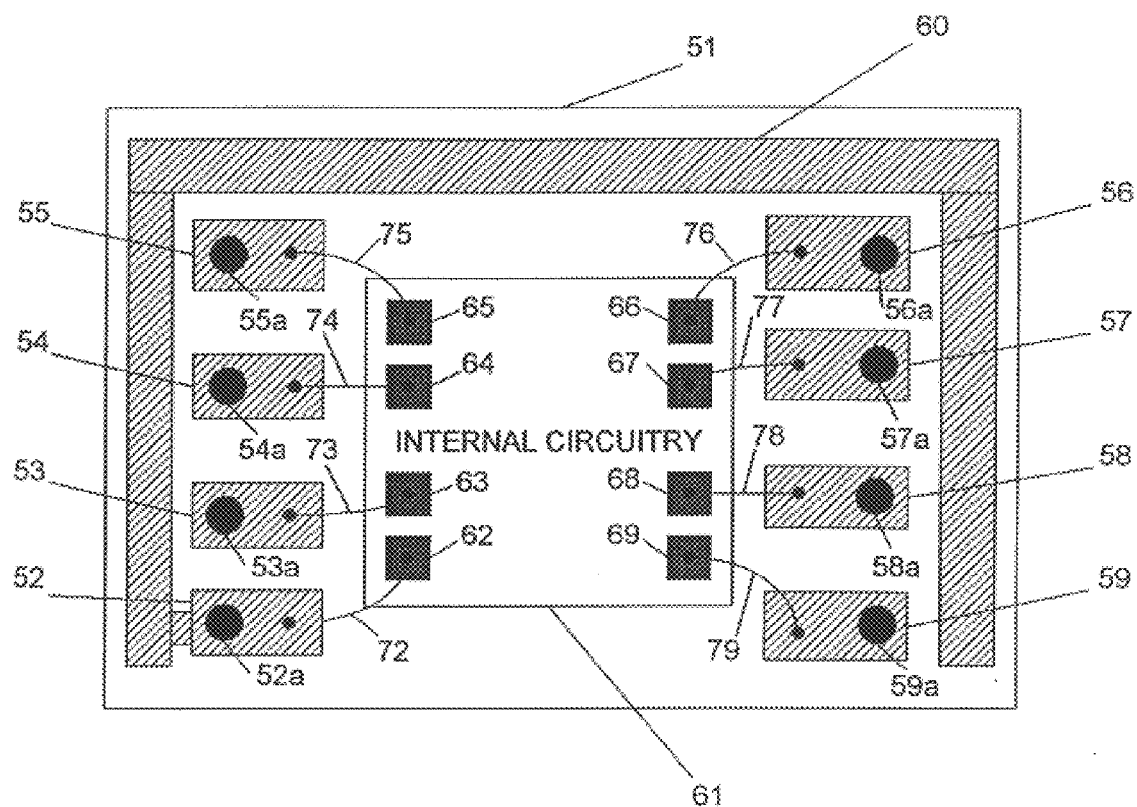
FIG. 5 is an example of an electrostatic discharge protective device in accordance with a preferred embodiment of the present invention.

The embodiment shown in FIG. 5 is an example of the present invention when ball bonding technology is used to interconnect the semiconductor chip to the substrate. The semiconductor chip, circuit, processor, or die 61 is glued into place on the back side of substrate 51. The bonding pads 62–69 are etched during the manufacturing process of the semiconductor chip 61. The bonding points 52–59 are etched during the manufacturing of the substrate 51. Holes or vias 52a–59a are also etched or drilled from the back side of the substrate (shown in this figure) to the front side of the substrate 51 (not shown in this figure) or etched or drilled from the front side to the back side. The holes or vias are used to conduct signals between the contact points on the front side of the substrate 51 to the chip 61 on the back side of the substrate 51. Also shown is a conductive path 60, which is directly coupled to one bonding point 52 and runs proximally around the remaining bonding points 53–59. In FIG. 5, the conductive path 60 is formed in the shape of an arch. Coupling the bonding points 52–59 to the bonding pads 62–69 are bond wires 72–79. These bond wires 72–79 are soldered to the bonding points 52–59 and the bonding pads 62–69 so as to form an electrical connection between the semiconductor chip's 61 bonding pads 62–69 and the substrate's bonding points 52–59.

The conductive path 60 protects the semiconductor chip 61 by providing a lower impedance path to ground than a path through the semiconductor chip 61. Thus, if charge accumulates on the card at any point, it will find a path to ground by jumping the gap between the conductive path 60 and the bonding points 53–59, be carried to the ground bonding point 52 instead of traveling through the semiconductor chip, and thus prevent damage to the semiconductor chip 61. It should also be noted that the gaps between the various bonding points 53–59 and the conductive path 60 can be manufactured differently for different tolerances of ESD protection. In other words, the larger the gap, the higher the gap's impedance is and the larger the ESD voltage and current must be before the charge is strong enough to bridge the gap and travel to ground via the conductive path 60. Similarly, different geometric shapes, such as ones containing points either in the conductive path 60 or the bonding points 53–59 may be employed to provide different tolerance levels of ESD.

Figure 6:
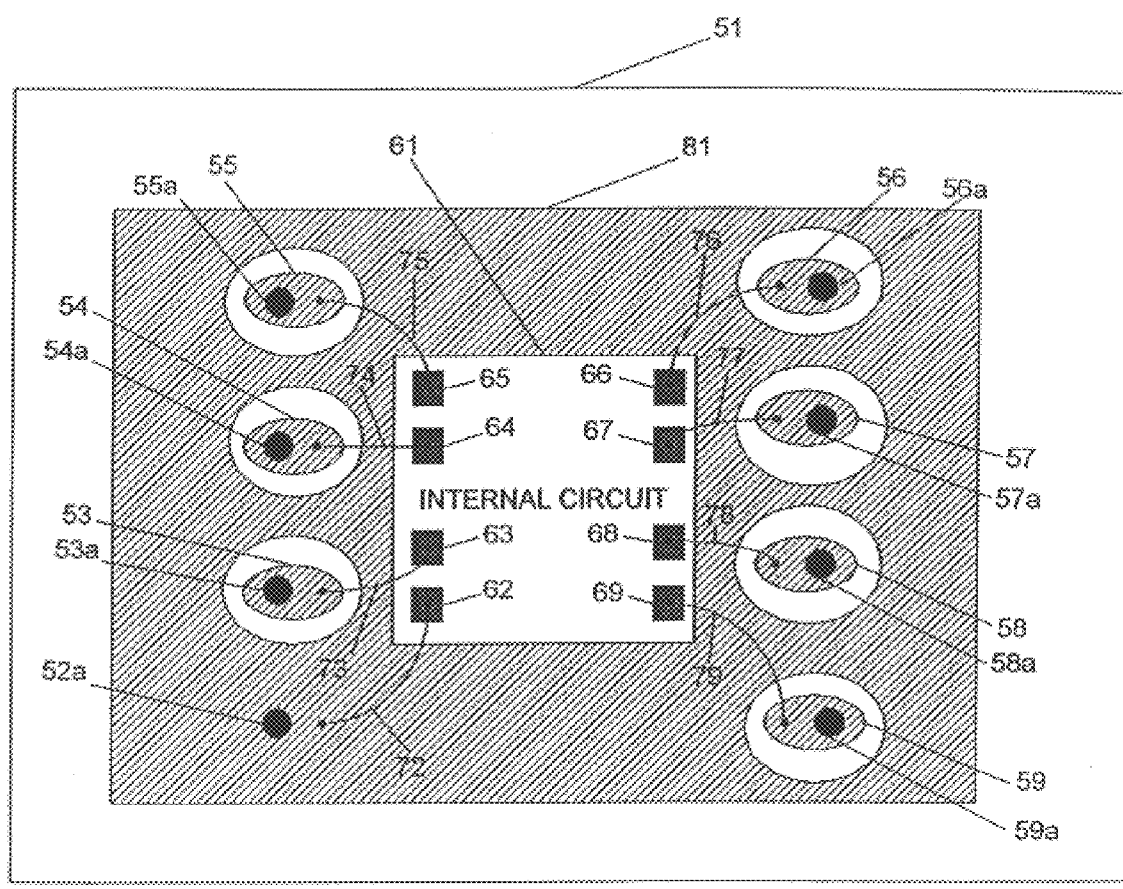
FIG. 6 is an example of an electrostatic discharge protective device in accordance with a preferred embodiment of the present invention.

FIG. 6 shows another embodiment of the present invention. Instead of an arch shape surrounding path, the conductive path is formed of a conductive plate 81. The semiconductor chip 61 is glued onto the conductive plate 81. Gaps are etched between the plate 81 and the bonding points 53–59. The bonding point 52 is the conductive plate 81 since both are kept at the same potential, and there is no need to insulate the bonding point 52 from the conductive plate 81. Again, holes or vias 52a–59a carry signals between the front side and back side of the substrate 51. Bond wires 72–79 couple the bonding pads 52–59 of the semiconductor chip 61 to the bonding points 52–59 on the substrate 51. A particular advantage of using the plate 81 instead of a conducting path is the ease of varying the size of the bonding points 53–59 and the gaps between the bonding points 53–59 and the conducting plate 81. Thus, if a particular application needs larger bonding points 53–59, in order to accommodate larger bond wires 72–79, the mask layers can easily be altered to provide for the larger bonding points 53–59.

Similarly, the gaps between the bonding points 53–59 are easily alterable by designing a different mask so as to provide narrower gaps for greater sensitivity to smaller ESDs and larger gaps for greater immunity to larger ESDs (i.e., the smaller the gap, the smaller the charge or voltage an ESD needs to jump the gap).

Figure 7:
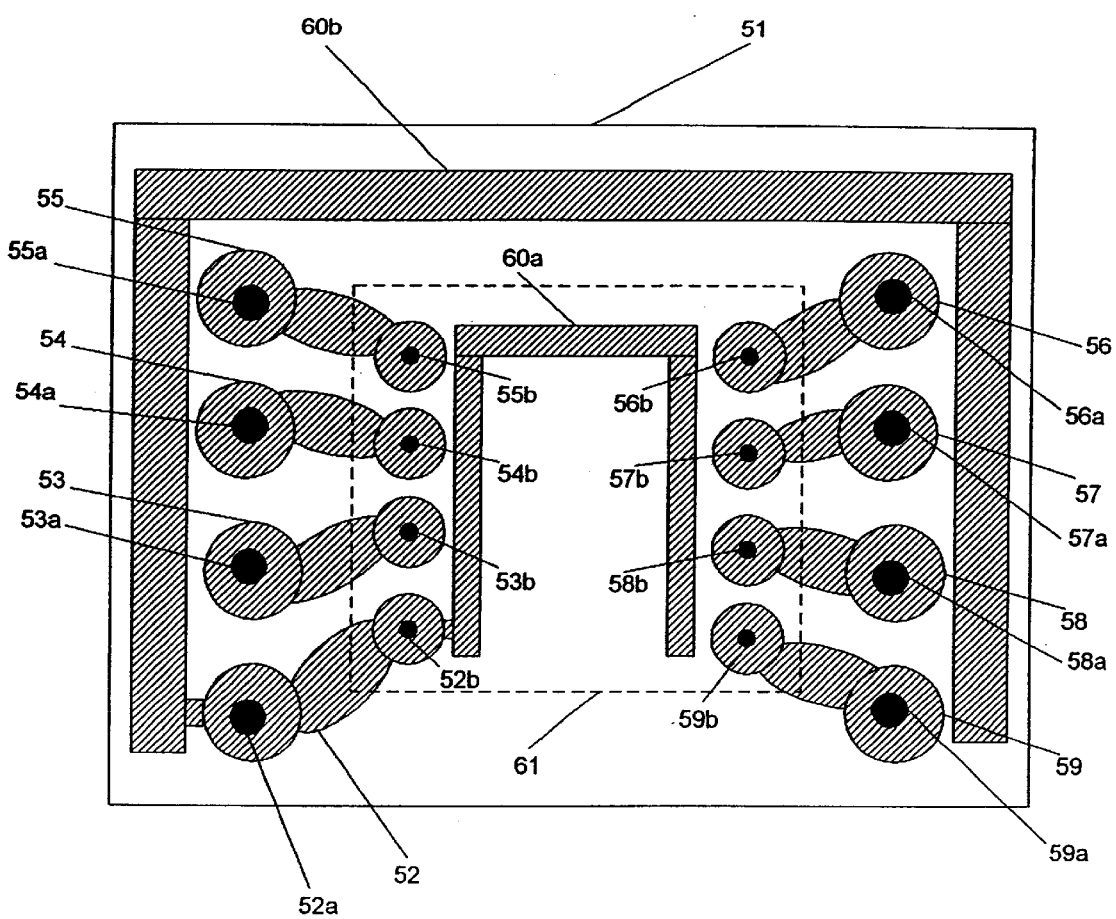
FIG. 7 is one view of an example of an electrostatic discharge protective device in accordance with a preferred embodiment of the present invention.

FIG. 7 shows another embodiment of the present invention, which uses flip chip technology. The semiconductor chip 61 is shown in a dashed line. It is placed over the bonding points 52–59 etched onto the substrate 51. The contact points on the front side of the substrate are typically spaced farther apart than the bonding pads on the semiconductor chip. Thus, to accommodate this spacing discrepancy, the bonding points 52–59 are extended in a direction so as to terminate underneath one hole or via 52a–59a, corresponding with a contact point on the front of the substrate 51.

FIG. 7 also shows two conductive paths 60a and 60b used in accordance with the present invention. Both conductive paths 60a and 60b are in the shape of an arch as can be seen from FIG. 7. Conductive path 60b circumscribes the bonding points 52–59 and conductive path 60a is circumscribed by the bonding points 52–59. As with the conductive paths shown in FIGS. 5 and 6, the conductive paths shown in FIG. 7 are used to carry ESDs to ground and away from the circuitry within the semiconductor chip 61.

Flip chip technology is usually accommodated in one of two ways. In one method, solder bumps 52b–59b are placed on the bonding pads located on the semiconductor chip 61 and on the bonding points 52–59. These solder bumps 52b–59b are heated and fused together in a soldering operation to make the appropriate connections (not shown).

Figure 8:
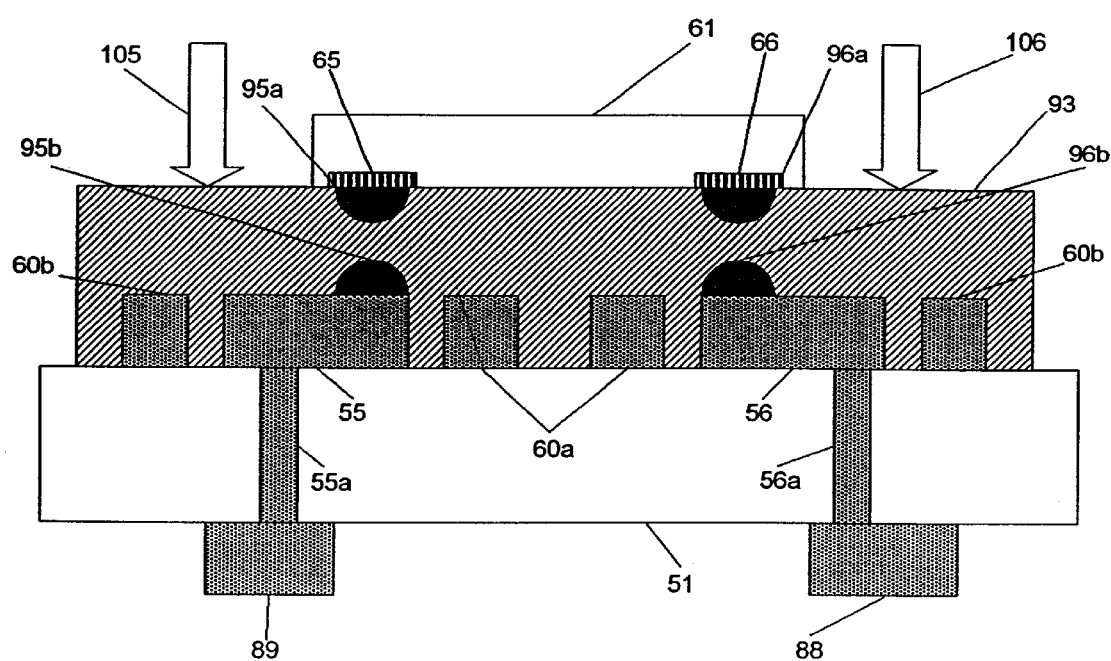
FIG. 8 is another view of the example of an electrostatic discharge protective device in accordance the preferred embodiment shown in FIG. 7.

In the second method, shown in FIG. 8, an elastomer epoxy 93 is deposited over the bonding points 52–59 and substrate 51. FIG. 8 represents a cross-sectional view of the card shown in FIG. 7, the observer is looking from the "top" at bonding points 52 and 59 "down," as shown in FIG. 8, through the structure to bonding points 55 and 56; the parts of the conductive paths 60a and 60b that cross FIG. 7 horizontally have been removed in FIG. 8 for the sake of clarity. The epoxy 93 is typically tacky. The semiconductor chip 61 is flipped onto this epoxy 93 in the appropriate position and pressed into the epoxy 93. The epoxy 93 in its normal, non-compressed state, has a high impedance value, so as to keep the various bonding pads and bonding points insulated from each other. The semiconductor chip is pressed into the epoxy 93, which causes the epoxy 93 to compress between the two sets of solder bumps 95a and 95b, and 96a and 96b. As the epoxy 93 is compressed in those localized regions, it becomes conductive and completes the circuit path between the bonding pads 62–69 and bonding points 52–59 via the solder bumps 92–99 (only 95 and 96 are shown in FIG. 8) while remaining insulative in every other non-compressed area. Thus, the semiconductor chip 61 is secured onto the substrate and given conductive paths for both power and signals via the bonding points 52–59 and the compressed epoxy 93.

In another embodiment of the present invention, forces 105 and 106 are applied above the gaps between the conductive path 60b and the bonding points 53–59. This force compresses the epoxy 93 directly above these gaps and makes the epoxy 93 more conductive. This lowers the impedance between the conductive path 60b and the corresponding bonding point and makes it easier for an ESD to bridge the gap to the conductor path 60b and away form the semiconductor circuit 61. The more force 105 or 106 that is applied, the lower the impedance of epoxy 93 in that region and the lower the voltage or current an ESD must have in order to bridge the gap to conductive path 60b as the ESD travels through the epoxy 93 from one of the bonding points 53–59.

This embodiment allows for a relatively simple and inexpensive method of providing a range of ESD tolerances without altering gap sizes, via the creation of new mask layers. By providing greater forces 105 and 106, the more compressed conductive epoxy 93 is created above the gap, which decreases the overall impedance between the conductive path 60b and a bonding point 55 or 56 and lowers the needed voltage or current for an ESD to bridge the gap. Thus, not only can different ESD tolerances be provided among smart cards sharing the same mask layers, but different ESD tolerances may be provided among bonding points 53–59 on the same smart card by applying variable amounts of force per bonding point.

Figure 9:
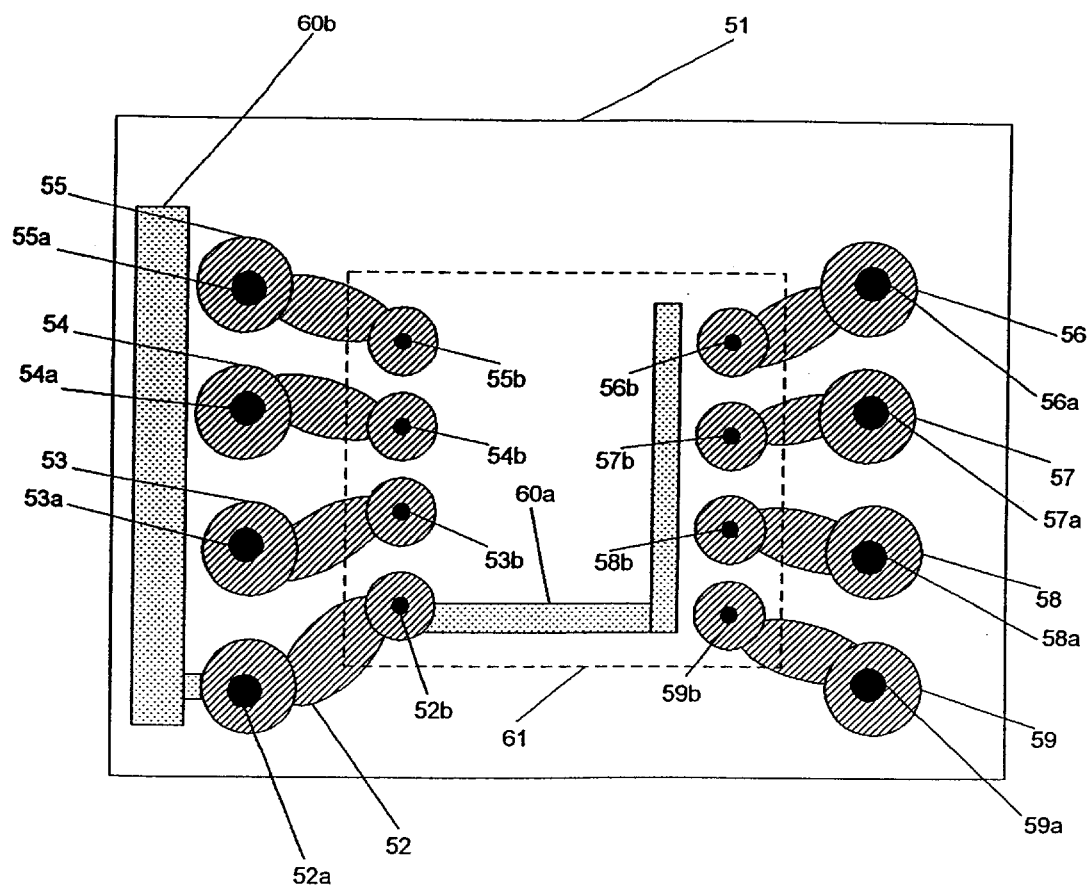
FIG. 9 is an example of an electrostatic discharge protective device in accordance with a preferred embodiment of the present invention.

FIG. 9 shows another embodiment of the present invention. Many features shown in FIG. 9 are identical to features shown in FIG. 7, therefore an explanation of these features can be found in the description of FIG. 7 above. FIG. 9 shows how two conductive paths are implemented to protect a semiconductor circuit 61 by dividing the bonding points 53–59 between the two conductive paths 60a and 60b. Conductive path 60b protects bonding points 53–55 from ESDs while conductive path 60a protects bonding points 56–59 from ESDs. Thus, two different conductive paths 60a and 60b protect two different sets of bonding points 53–55 and 56–59. FIG. 9 also shows how the conductive paths can be shaped as bars, 60b, and L's, 60a.

FIG. 9 also shows another variation of the present invention. Conductive paths 60a and 60b are fabricated at either different times or made out of different materials or both than the bonding points 52–59 as demonstrated by the different shading. The manufacturer may wish to use this two layer metal process to either save money on purchasing one type of conductive material or to achieve a desired tolerance for ESD by virtue of the two different materials.

Additionally, the use of two layers allows a manufacturer to implement the present invention into a pre-existing mask pattern. If a manufacturer has already designed the masks for building the bonding points 52–59 on a first layer of metalization, it is a relatively simple and inexpensive process to design a second layer of metalization for the conductive paths 60a and 60b. Thus, the present invention can easily be added to a pre-existing process for placing semiconductor chips on substrates.

Figure 10:
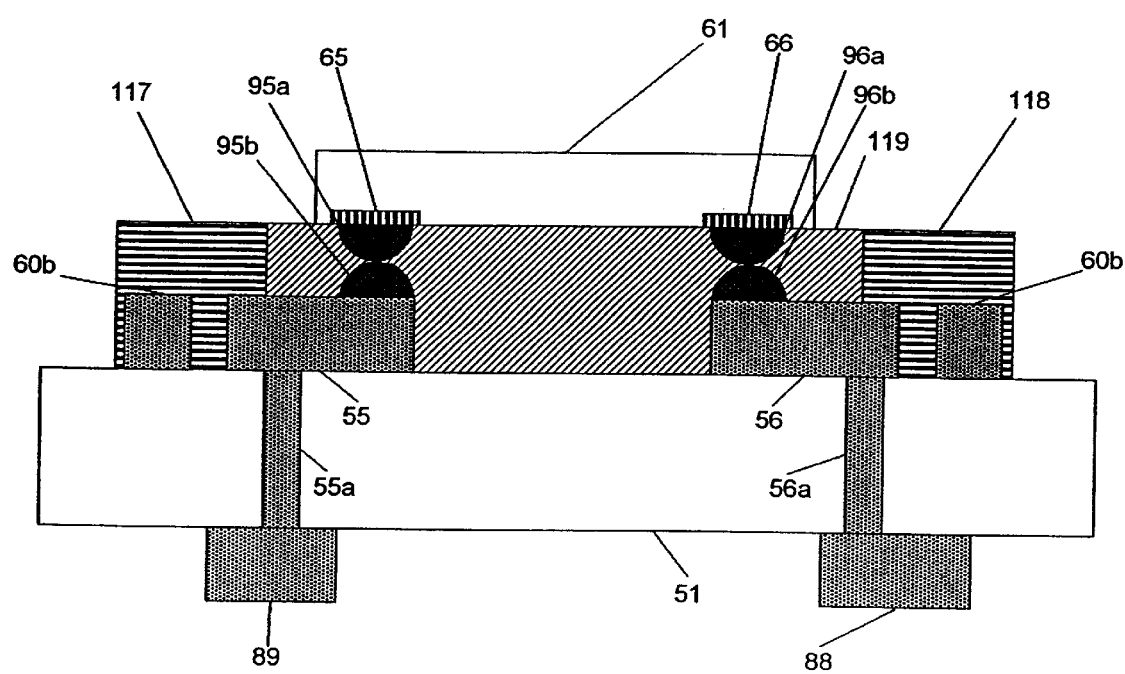
FIG. 10 is an example of an electrostatic discharge protective device in accordance with another embodiment of the present invention.

FIG. 10 shows another variation within the scope of the present invention. FIG. 10 lacks the inner conductive path 60a of FIG. 8. FIG. 10 also shows how soldering is accomplished in flip chip technology. Solder bumps 95a and 96a are first deposited onto the bonding pads 65 and 66. Solder bumps 95b and 96b are then deposited onto the bonding points 55 and 56. The semiconductor circuit 61 is then flipped over so that solder bumps 95a and 96a are in contact or close proximity to solder bumps 95a and 96b. Heat is applied so that the two sets of solder bumps are fused together to complete the connection. Insulator 119 may be injected, or air may act as the insulator 119, so as to keep the various bonding points and bond pads isolated from each other.

FIG. 10 also shows the utilization of a dielectric material 117 and 118 to change the tolerance of the lowest level, voltage or current, ESD required to bridge the gap between bonding points 55 and 56 and conductive path 60b. By adding the appropriate dielectric 117 and 118, the strength of the ESD needed to bridge the gaps between the bonding points 55 and 56 and the conductive path 60b may increase or decrease.

This feature gives the present invention a level of dynamic behavior in the future to protect newer semiconductor circuits 61 as they change in design over time. This feature is best visualized by removing the inner conductive path 60a of FIG. 8. A semiconductor circuit designed at some point in time may be able to handle ESDs of X volts or Y mA, where X and Y are both positive values. Thus, a dielectric 117 and 118 is added to FIG. 10 so that any ESD greater than X volts or Y mA will bridge the gap between the bonding point 55 or 56 and the conductive path 60b, and flow harmlessly away from the semiconductor circuit 61. In the future, the transistors within the semiconductor circuit 61 may be designed so that they cannot handle smaller voltages such as X-a volts or smaller currents such as Y-b mA without being damaged. (Note: a and b are also positive numbers). Without redesigning the masks used to layout the various layers shown in FIG. 10, a different dielectric 117 and 118 is used to decrease the impedance of the gaps between the bonding points and the conductive path 60b. In this manner, a smaller ESD is able to bridge the gaps and protect the semiconductor circuit 61 from smaller ESDs via the utilization of a different dielectric.

While the invention is described using particular examples and embodiments, it should be obvious to one of ordinary skill in the art to make changes to the specific examples given without deviating from the scope of the invention as defined by the appended claims. Examples of obvious modifications include using other shapes such as squares and circles instead of the arches shown in FIGS. 5 and 7. Another obvious modification to the embodiment shown in FIGS. 5 and 7 includes rounding the corners of the arch shown. Additionally, the relative position of the conductive path, inside the bonding points or outside, is another variation one of ordinary skill in the art could make without deviating from the scope of the present invention.

Also, rearranging the order of the process of making the chip discussed above is an obvious variation to one of ordinary skill in the art. Additionally, while chemical depositing and etching techniques are the standard for placing the conducting materials on the substrate, the present invention encompasses using mechanical depositing and etching techniques to place the conducting materials on the substrate.

What is claimed is:

1. A method for protecting a semiconductor circuit attached to a substrate from electrostatic discharge wherein the substrate has a back side and a front side comprising:

etching a first conductive material on the back side of the substrate to form a plurality of bonding points, the bonding points being coupled to the semiconductor circuit;

etching a second material on the back side of the substrate to form a conductive path directly coupled to a first bonding point and being laid out in a proximal position to a second bonding point;

creating holes through the substrate directly above the bonding points; and etching a third conductive material on the front side of the substrate so as to form contact points, the contact points being coupled to the bonding points via the holes through the substrate.

2. The method of claim 1, wherein the contact points are patterned so as to form a source identifier.

3. The method of claim 1, wherein the contact points form a pattern consisting of at least one of the following: an oval logotype; a square logotype; a rectangular logotype; and a circular logotype.

4. The method of claim 1, wherein said substrate consists of at least one of the following: a circuit board; a fiberglass board; an epoxy board; greenboard; blackboard; and blueboard.

5. The method of claim 1, wherein the third conducting material consists of at least one of the following: a copper surface; a copper surface with silver plating; and a copper surface with gold plating.

6. The method of claim 1, wherein the conductive path is in the shape of a bar.

7. The method of claim 1, wherein the conductive path is in the shape of an "L."

8. The method of claim 1, wherein the conductive path is in the shape of an arch.

9. The method of claim 1, wherein the conductive path is in the shape of a square.

10. The method of claim 1, wherein the conductive path is in the shape of a circle.

11. The method of claim 1, wherein the conductive path circumscribes the bonding points.

12. The method of claim 1, wherein the bonding points circumscribe the conductive path.

13. The method of claim 1, wherein the conductive path and the first bonding point attached to the conductive path form a plate upon which the semiconductor circuit is attached and wherein the plate circumscribes the other bonding points.

14. The method of claim 1, further comprising etching a fourth conductive material on the back side of the substrate to form a second conductive path, the second conductive path being coupled to the first bonding point and being laid out proximally to a third bonding point.

15. The method of claim 14, wherein the first, second and fourth conductive materials are the same.

16. The method of claim 14, wherein the first conductive material is different from the second and fourth conductive materials.

17. The method of claim 14, wherein the second and third bonding points are the same.

18. The method of claim 14, wherein the second and third bonding points are different.

19. The method of claim 1, wherein the bonding points are coupled to the semiconductor circuit by soldering bond wires.

20. The method of claim 1, wherein the bonding points are coupled to the semiconductor circuit by using flip chip technology.

21. The method of claim 20, wherein flip chip technology further comprises soldering the semiconductor circuit to the plurality of bonding points.

22. The method of claim 20, wherein using flip chip technology further comprises using an epoxy to couple the semiconductor circuit to the plurality of bonding points.

23. The method of claim 22, further comprising compressing a region containing the epoxy located in the proximal position near the second bonding point and the first conductive path.

24. The method of claim 1, further comprising depositing a dielectric into a proximal position between the first conductive path and the second bonding point.

25. The method of claim 1, wherein the semiconductor circuit, substrate, and first, second and third conductive materials are placed in a plastic frame which is the size and shape of a standard credit card.

26. The method of claim 25, wherein the semiconductor circuit, substrate, plastic frame, and first, second and third conductive materials comprise a smart card.

27. A method of discharging an apparatus containing a semiconductor circuit, a visible portion, a non-visible portion, and a charge located on either the visible portion or non-visible portion of the apparatus, wherein the method comprises:

carrying the charge through a relatively high impedance path located on the non-visible portion of the apparatus to a relatively low impedance path located on the non-visible portion of the apparatus; and carrying the charge through the relatively low impedance path to a low potential.

28. The method of claim 27, wherein the apparatus is a smart card.

* * * * *